United States Patent [19]

Schlegel

[11] 4,060,825
[45] Nov. 29, 1977

[54] HIGH SPEED HIGH POWER TWO TERMINAL SOLID STATE SWITCH FIRED BY dV/dt

[75] Inventor: Earl S. Schlegel, Plum Borough, Pa.

[73] Assignee: Westinghouse Electric Corporation, Pittsburgh, Pa.

[21] Appl. No.: 656,497

[22] Filed: Feb. 9, 1976

[51] Int. Cl.$^2$ .............................................. H01L 29/74
[52] U.S. Cl. ........................................ 357/38; 357/13; 357/20; 357/86
[58] Field of Search ....................... 357/13, 20, 38, 39, 357/86

[56] References Cited

U.S. PATENT DOCUMENTS

| | | | |
|---|---|---|---|
| 3,236,698 | 2/1966 | Shockley | 357/38 |
| 3,697,833 | 10/1972 | Nakata | 357/38 |
| 3,766,450 | 10/1973 | Voss et al. | 357/38 |
| 3,858,236 | 12/1974 | Schafer et al. | 357/38 |
| 3,893,153 | 7/1975 | Page et al. | 357/38 |

Primary Examiner—Stanley D. Miller, Jr.
Assistant Examiner—Joseph E. Clawson, Jr.
Attorney, Agent, or Firm—H. W. Patterson

[57] ABSTRACT

A high speed, high power, four layer, two-terminal silicon diode switch or thyristor designed to be fired by dV/dt induced current is disclosed. The device includes a shunted main cathode emitter, and an auxiliary cathode emitter centrally of the main cathode emitter. The auxiliary cathode emitter is so dimensioned that it is deeper than the main cathode emitter; and the product of (1) the capacitance of the central forward blocking PN junction within the confines of the outer edge of the auxiliary cathode emitter, and (2) the effective radial resistance of the cathode base beneath the auxiliary cathode, and (3) the rate of application of the firing voltage on the anode dV/dt, is at least equal to seven tenths of a volt.

4 Claims, 3 Drawing Figures

HIGH SPEED HIGH POWER TWO TERMINAL SOLID STATE SWITCH FIRED BY DV/DT

BACKGROUND OF THE INVENTION

1. Field of the Invention

The present invention relates to two-terminal solid state four layer PNPN semiconductor diode switches deisiged to be fired by $dV/dt$.

2. Description of the Prior Art

A two-terminal, solid state, four layer PNPN semiconductor diode switch of the thyristor type may be fired by either the dV/dt or a high level of the applied anode to cathode voltage. This is in contrast to a three-terminal switching device that is designed to be fired by the application of a relatively low amplitude pulse, applied to a cathode or P-base. Two terminal switches are turned-off by commutation of the load current.

Conventional two-terminal diode switches when designed for high power, high speed requirements are prone to failure during turn-on because of localized heating of the device, and they also suffer switching losses. In order to avoid such localized heating, the semiconductor layers are designed to have uniform impurity densities throughut so that conduction is initiated simultaneously over its entire area. Such impurity density uniformity, however, for high power devices is difficult to achieve to the extent required. Such devices frequently turn-on slowly for a given $dV/dt$ and fire in an uncontrolled manner.

Thus, it is desirable to have a two-terminal high speed, high power, solid state semiconductor switching device that has low switching losses, turns on reliably in a short period of time, and is not prone to failure because of localized heating, without the difficulty of achieving inordinate impurity density uniformity of the semiconductor layers.

In accordance with the present invention, a manner of achieving such results is to construct such a two-terminal four layer PNPN device having an auxiliary cathode emitter and a shunted main cathode emitter. Such auxiliary cathode emitter can be so constructed that the product of the $dV/dt$-induced capacitive current in the cathode base region within the confines of the outer edge of the auxiliary cathode, and the effective radial resistance of the cathode base beneath the auxiliary cathode emitter, and the rate of application of the $dV/dt$ firing voltage is at least equal to the voltage on the cathode emitter junction that is capable of firing the device.

It is common practice to use auxiliary cathode emitters in three-terminal solid state four layer semiconductive thyristor devices, where a low amplitude gating pulse is applied to the central portion of the cathode base to fire the device. In such devices, the auxiliary cathode emitters are used to provide an improved $dI/dt$ capability, (i.e., the rate of current increase or "turn-on" as a function of time) and to reduce the current carrying requirements of the gate electrode supply.

However, as far as is known, a two-terminal solid state four layer semiconductor diode switch prior to the present invention, has not been proposed that includes an auxiliary cathode emitter and a shunted main cathode emitter constructed as described herein to improve the switching losses, reliability, predictability, and turn-on response to $dV/dt$ (i.e., the rate of applied anode voltage increase as a function of time).

SUMMARY OF THE INVENTION

The invention relates broadly to an improved high speed, high power, two-terminal, four layer, solid state, semiconductor switch adapted to be turned on by a predetermined rate of load voltage increase as a function of time, and includes an auxiliary cathode emitter region. More specifically, the device includes a semiconductor body having four impurity regions of alternate conductivity type disposed through the body, with PN junctions formed between adjacent impurity regions. The body of the device has a first and second outer surface which is in ohmic contact with a cathode electrode and an anode electrode, respectively. The auxiliary, and a main, cathode emitter and the cathode base regions adjoin the first outer surface and the anode emitter region adjoins the second outer surface. The impurity region interior of the body adjoining the cathode base and anode-emitter regions is the anode-base region. The auxiliary cathode emitter region and a main cathode emitter region of the device are radially spaced apart and have surfaces forming a portion of the first outer surface of the body. A portion of the cathode base region forms a portion of the first outersurface of the semiconductor body between the auxiliary cathode emitter and the main cathode emitter; and also, at predetermined locations beneath and in ohmic contact with the cathode electrode to provide a shorted main emitter.

The auxiliary cathode emitter is of such dimension that the effective resistance of the cathode base beneath the auxiliary cathode emitter is greater than such resistance beneath the main cathode emitter. Also, the effective resistance in the cathode base beneath the auxiliary cathode emitter region is equal to the voltage on the auxiliary cathode emitter junction sufficient to fire the device divided by the $dV/dt$ induced capacitive current. The product of (1) the $dV/dt$ induced displacement current, and (2) the resistance in the cathode base region beneath the auxiliary cathode emitter, is greater than seven tenths of a volt, to cause conduction rapidly between the cathode electrode and the anode electrode in response to the application of a predetermined increase in the load voltage as a function of time. The shunted emitter beneath the cathode electrode insures that the auxiliary cathode emitter fires before the main cathode emitter. A metallic electrode is in ohmic contact with the first outer surface and overlies the outer edge of the auxiliary cathode emitter region to provide a source of electrons for the auxiliary cathode emitter region.

DESCRIPTION OF THE PREFERRED EMBODIMENT

Figure 1:
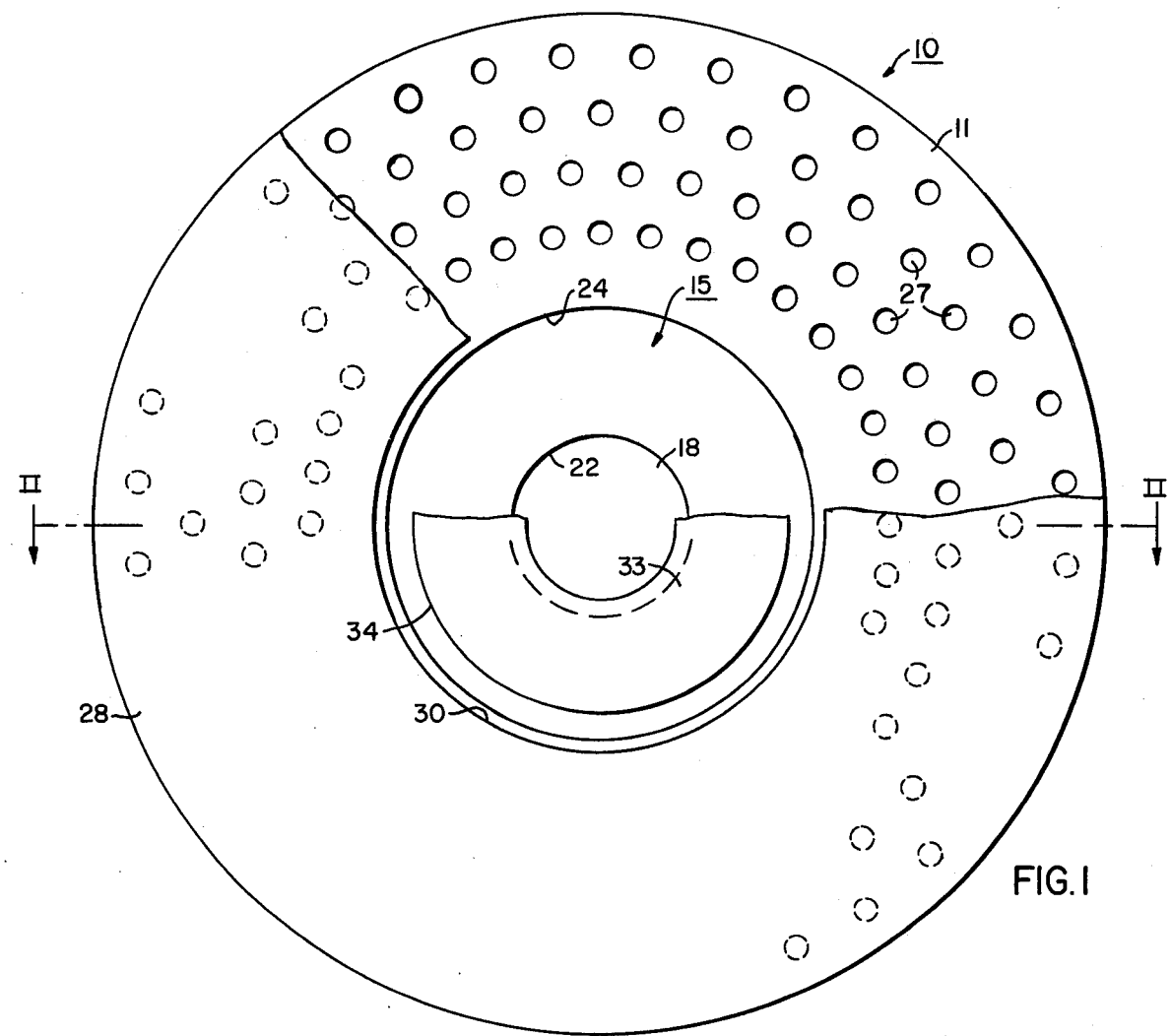
FIG. 1 is a greatly enlarged plan view of a two terminal solid state semiconductor device according to one embodiment of the invention with metal electrodes partly broken away to show the diffusion pattern.
Figure 2:
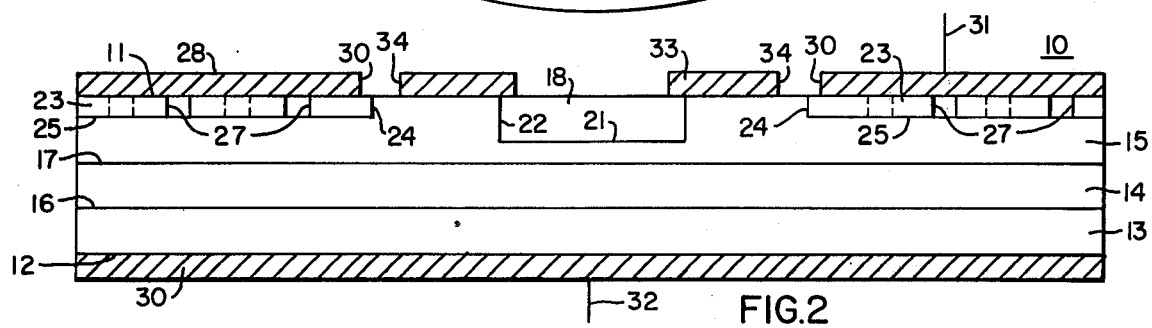
FIG. 2 is a sectional view taken on lines 2—2 of FIG. 1.
Figure 3:
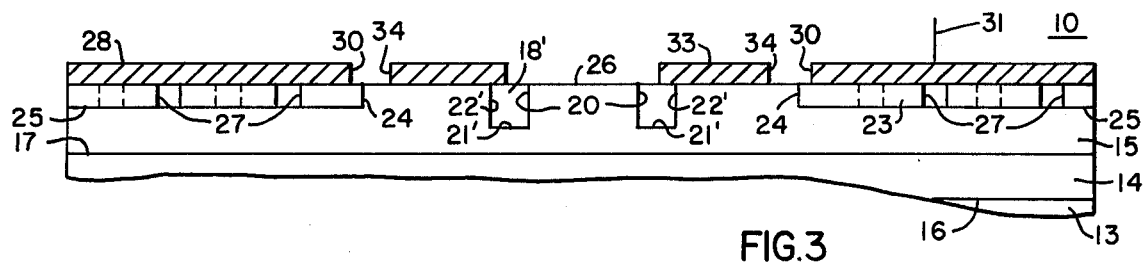
FIG. 3 is a fragmentary cross-section similar to FIG. 2 except that the auxiliary cathode emitter region is annular and surrounds a portion of the cathode base region on the first outer surface in accordance with another embodiment of the invention.

Referring to the drawings, a semiconductor body 10 is provided for forming a high speed, high power, four layer two-terminal silicon diode switch designed to be fired by $dV/dt$ induced current in accordance with the present invention. The semiconductor body 10 is typically a commercially available single-crystal silicon wafer of circular shape having a thickness typically of about 0.25 to 0.50 mm, and having first and second opposed outer surfaces 11 and 12, respectively. Provided in these semiconductor body 10 are suitable impurities, to form impurity regions 13, 14, 15 and 18 of alternate type conductivity. A surface of the impurity region 13 forms the outer surface 12 of anode-emitter region. The impurity region 14 is disposed in the body 10 adjacent the anode-emitter region 13 at junction 16 to form an anode base region. The impurity region 15 adjoins the anode base region 14 at junction 17 to form a cathode base region. The impurity region 18 of FIG. 2 is disc-shaped in configuration and has a surface that forms the central portion of the first outer surface 11. The impurity region 18' of FIG. 3 is annular in shape and surrounds a portion 26 of surface 11 of the cathode base region 15 in the center of the body 10. The impurity region 18 or 18' forms an auxiliary cathode emitter region. In the embodiment of FIG. 2, this region 18 forms a PN junction at its bottom edge 21 and at its outer edge 22. In the embodiment of FIG. 3 the region 18' also adjoins the cathode base region 15 to form a PN junction at its inner edge 20, as well as at its bottom edge 21' and at its outer edge 22'. An impurity region 23 of the same conductivity type as the impurity region 18 or 18', which, of course, is the type that is alternate to the cathode base region 15, has an inner PN junction or edge 24 that is radially spaced from the outer edge 22 with a bottom PN junction 25 to form a second or main cathode emitter region. The auxiliary cathode emitter regions 18 and 18' extend to a greater depth in the cathode base region 15 than the main cathode emitter region 23. A surface of the cathode base region 15 between the outer junction 22 of the auxiliary cathode emitter 18 or 18' and the inner junction 24 of the cathode emitter 23 forms a portion of the first outer surface 11 between the auxiliary cathode emitter 18 and the main cathode emitter 23. The main cathode emitter 23 in the described embodiment also has a plurality of circular openings 27 which surround portions of the cathode base 15 on the outer surface 11. A metallic cathode electrode 28 usually of circular symmetry overlies and is in ohmic contact with the cathode emitter region 23 and the portions of the cathode base 15 at the openings 27. An inner edge 30 of the metallic main cathode electrode 28 is spaced outwardly radially from the inner edge 24 of the main cathode emitter region 23 so as not to overlie that portion of the cathode base region 15 between the inner edge 24 and the outer edge 22 of the cathode emitter regions 23 and 18 or 18', respectively. The metallic cathode electrode 28 forms emitter shunts between the cathode emitter 23 and the portions of the cathode base 15 that extend through the openings 27 to the surface 11. A metallic anode electrode 30 is in ohmic contact with the surface of the anode emitter region 13 that forms the second outer surface 12 of the semiconductor body 10. A cathode terminal 31 and an anode terminal 32 are shown schematically electrically connected to the cathode electrode 28 and the anode electrode 30 respectively for connection to any suitable external circuit. A metallic electrode 33 of annular configuration is in ohmic contact with the outer surface 11 and is so dimensioned and disposed that it overlies the outer edge 22 or 22' of the auxiliary cathode emitter 18 or 18'. The metallic electrode 33 is so dimensioned that its outer edge 34 is radially spaced from and out of contact with inner edge 24 of the main cathode emitter region 23.

Typically, the impurities and impurity regions as above described are provided in the semiconductor body 10 by standard diffusion techniques. Alternatively, the impurity regions may be provided by epitaxial growth or a combination of epitaxial growth and diffusion.

To illustrate, the impurities and impurity regions are typically provided by commercially obtaining semiconductor body 10 uniformly doped with an N-type impurity, such as phosphorous or arsenic, to a concentration typically between about $5 \times 10^{13}$ and $5 \times 10^{14}$ atoms/cm$^2$, i.e., 200 to 10 ohm-cm. The body 10 is typically diffusion doped with a P-type impurity such as boron, gallium and/or aluminum through the first and second outer surfaces 11 and 12 by standard diffusion techniques to form the cathode base and anode-emitter regions 15 and 13. The anode base region 14 is formed at the same time between regions 15 and 13 by the residual N-type impurity of the body. The anode base region 14 typically has a thickness between about 150 and 350 microns, depending upon the desired voltage rating of the device. The cathode base and anode emitter regions 15 and 13 have surface impurity concentrations of typically between about $5 \times 10^{15}$ and $1 \times 10^{18}$ atoms/cm$^3$.

After the initial diffusions, first and second outer surfaces 11 and 12 are masked with a standard diffusion mask such as silicon dioxide. Typically, this masking is accomplished by heating the semiconductor body 10 in an oxygen-rich atmosphere such as steam to about 1100° 14 1250° C for 3 to 4 hours. A window pattern suitable for forming the cathode emitter region 18 or 18' is then opened in the masking layer covering the outer surface 11 by standard photolithographic and etching techniques. The impurity region 18 or 18' is partially diffused into the semiconductor body 10 through the opened window pattern of the outer surface 11 with an N-type impurity such as phosphorous by a standard diffusion method. Another window pattern is then opened to similarly form the cathode emitter region 23 adjoining the outer surface 11. Both regions 23 and 18 or 18' have a surface concentration typically of about $1 \times 10^{19}$ to $1 \times 10^{21}$ atmos/cm$^3$. Region 23 has a diffusion depth typically of about 10 to 20 microns. The cathode emitter region 18 or 18' is formed adjoining the outer surface 11 adjacent to and spaced apart from the cathode emitter region 23 with a surface concentration typically of about $1 \times 10^{19}$ to $1 \times 10^{21}$ atoms/cm$^3$ and a diffusion depth deeper than that of the cathode emitter region 23 to increase the resistance under the auxiliary cathode emitter 18 or 18'. This increased resistance allows one to maintain the area of the cathode base 15 within the area of and beneath cathode emitter region 18 or 18' relatively small. For example, if the auxiliary cathode emitter 18 of FIG. 2 has an outer radius of 1.25 mm, or if the auxiliary cathode emitter 18' of FIG. 3 has an inner radius of approximately 1.25 mm and an outer radius of approximately 1.75 mm; and if a $dV/dt$ of 5 KV/microsecond is used to fire the device of either embodiment, the sheet resistivity under the auxiliary cathode emitter region 18 or 18' should be approximately 10 times that under the main cathode emitter region 23. This may be achieved by diffusing the auxiliary cathode emitter approximately 26 microns in depth.

After the completion of the diffusions, and the preferred selective etching, the semiconductor body 10 is disposed on anode electrode 30 with the second outer surface 12 of the body in contact with a major surface of the electrode. The electrode 30 is usually separately formed of molybdenum or tungsten in a circular shape at least as large as the semiconductor body 10 and is usually 50 to 80 mils thick. The electrode 30 is alloyed to the outer surface 12 by heating the electrode 30 and the body 10 in intimate contact in an inert atmosphere such as argon to a temperature typically of about 680° C. In this way, the electrode 30 makes preferably low resistance, ohmic contact with the anode-emitter region 13 across the entire outer surface 12. The cathode electrode 28 and the electrode 33 are then preferably simultaneously formed on the outer surface 11. The electrode 28 and 33 may be of any suitable metal, such as aluminum, which will provide preferably an ohmic low resistance contact, and can be readily vapor or sputter deposited on the outer surface 11. The electrodes 28 and 33 are formed by deposition over the entire surface followed by standard photolithographic masking and etching techniques.

The auxiliary cathode emitter 18 or 18' is so dimensioned that the $dV/dt$-induced displacement current originating from the area of the cathode base region beneath, (that is, within the confines of the outer edge 22 of) the auxiliary cathode emitter 18, and the effective resistance of the portion of the cathode base region 15 beneath the auxiliary cathode emitter region 18 or 18' are sufficiently large that the product of such displacement current and effective resistance (i.e., the IR drop) is greater than seven tenths of a volt. Expressed mathematically, $$0.7 < CR\, dV/dt$$

where
- $C$ is the capacitance of the central forward blocking junction 17 in the area coextensive with the area of the auxiliary cathode 18;
- $R$ is the effective radial resistance of the cathode base 15 beneath the junction 21 of the auxiliary cathode 18; and
- $dV/dt$ is the rate of application of the triggering voltage on the anode electrode 30 via the terminal 32.

A typical two-terminal solid state semiconductor device constructed in accordance with the present invention might have a capacitance per unit area as defined above equivalent to 100 PF/cm² at an anode voltage of 500 volts. The area of the cathode base region within the auxiliary cathode emitter 18 would be 0.5 cm² and within the emitter 18' would be 0.05 cm². This results in a capacitance of 5.0 PF. The effective resistance in these cases would be in the order of 2000 ohms which would be capable of firing the device at a $dV/dt$ greater than 70 V/microsecond. It is understood, that these parameters may be tailored to change the $dV/dt$ that is required to fire the device, depending on the particular requirements.

In operation, an operating load voltage is applied between the anode electrode 30 and the cathode electrode 28 across the semiconductor body 10. The applied load voltage is such that the device is in a forward high impedance blocking state. In response to a $dV/dt$ such as 70 V/microsecond, for example, a displacement current is induced to flow uniformly from the entire area of junction 17 to the cathode electrode 28 through the shunts at 27. This current flowing through the lateral resistance of cathode base 15 creates a voltage drop (IR) that forward biases the auxiliary cathode emitter 18 adjacent its central portion; and in the embodiment of FIG. 3, forward biases the auxiliary cathode emitter 18' at edges 20, 21. The main cathode emitter region is forward biased at the edges 24 and 25. This voltage drop is highest at the corner formed by the edges 20 and 21' for the embodiment of FIG. 3, and highest at the center of the edge 21 of auxilary cathode emitter 18 in the emboidment of FIG. 2. This forward voltage at these edges forces the device to fire first in its central region defined by the dimensions of the auxiliary cathode emitter 18 or 18'. This causes the device to turn on more rapidly, with lower switching losses and with less likelihood of failure than if initial firing occurred at some undefined area in the main cathode emitter of a device without the benefit of the invention.

The reason the device fires first at its central region is due to the fact that the deeper emitter junction depth of the auxiliary cathode emitter 18 or 18' as compared with the depth of the main cathode emitter 23, results in a higher current gain in the auxiliary thyristor or auxiliary cathode emitter region than in the main thyristor or main cathode emitter region. Also, the firing at the auxiliary cathode emitter 18 or 18' is confined to a smaller area during the initial firing and thereby forces the current density to build up more quickly.

Since the current gain of shunted cathode thyristors increases rapidly with increasing current density, the current gains increase rapidly along with the increasing current density. This causes the regenerative thyristor action to build up very rapidly and with a minimum of energy loss.

This rapid, low loss turn-on is caused to occur in a well defined area and the device is less liable to fail than if there were no auxiliary cathode emitter 18 or 18' and the main cathode emitter 23 is permitted to fire in a non-predetermined area of unknown size and location, and without the enhancement of the current gains achieved by the deeper emitter junction 21 or 21'.

Once the auxiliary thryristor action occurs and the device fires, it turns on the remainder of the device in the same well known manner as for three terminal devices.

The metallic electrode 33 which overlies the outer edge 22 of the auxiliary cathode emitter 18 provides a path for current from the anode through the auxiliary thyristor or cathode emitter 18, 18' to the main thyristor or cathode emitter 23. Without this electrode 33, the auxiliary thyristor region in the central portion of the device would have no source of electrons for turn-on.

In summary, a four layer PNPN two terminal solid state switch having an auxiliary cathode emitter 18 or 18' that is diffused more deeply than the main cathode emitter 23 as described herein causes the devices to fire initially in a predetermined small well-defined area. This insures rapid current density build up resulting in a rapid increase in current gain during turn-on. This decreases the turn-on time and the turn on switching loss. Further, this well controlled fast low loss turn-on decreases the probability of failure during turn-on.

Also, the auxiliary cathode region 18 or 18' is sufficiently dimensioned that the product of the $dV/dt$ induced capacitive current from such area and the resistance in the cathode base 15 beneath the auxiliary cathode emitter 18 or 18' is sufficiently large (0.7-1.0 V) to fire the auxiliary cathode emitter 18 or 18'.

While the presently preferred embodiment of the invention has been specifically described, it is distinctly understood that the invention may be other wise variously embodied with alternate configurations of the metallic electrode 33 and the metallic electrode 28, such as providing radially extending fingers on the electrode 33 with corresponding recesses in the electrode 28 to provide for interdigitation, for example, or the electrode 33 in the embodiment of FIG. 2 may be disc-shaped. Also, various other cathode shunt or shorted emitter configurations may be utilized and the relative depths and diameter of the auxiliary cathode emitter relative to the main cathode emitter 23 may be varied in accordance with the teaching of the present invention and the scope of the appended claims.

I claim:

1. A two-terminal thyristor adapted to be fired by $dV/dt$ comprising:
   A. a body of semiconductor material having first and second outer surfaces, with at least four impurity regions of alternate type conductivity disposed through the body between the outer surfaces forming PN junctions between adjoining regions;
   B. said regions being a cathode emitter region and a cathode base region adjoining parts of the first outer surface of the body, an anode base region, and an anode emitter region adjoining at least a portion of the second outer surface of the body;
   C. said cathode emitter region including an auxiliary emitter region and a main emitter region, said auxiliary emitter region adjoining a portion of the first outer surface spaced centrally of the main emitter region
   D. said cathode base region adjoining at least a portion of the first outer surface between the auxiliary emitter region and the main emitter region, and adjoining the first outer surface at predetermined locations bounded by the main emitter region to form cathode shunts;
   E. said auxiliary emitter region being dimensioned such that $0.7 < CR\ dV/dt$, where C is the capacitance of a PN junction portion between the cathode base region and an anode base region within the confines of the outer boundary of the auxiliary emitter region, R is the effective radial resistance in the cathode base region under the auxiliary cathode emitter region, and $dV/dt$ is the rate of application of a triggering voltage on the anode electrode hereinafter recited;
   F. a metallic electrode in ohmic contact with the first outer surface and overlying at least a portion of the auxiliary region and a portion of the cathode base region outwardly from the auxiliary region;
   G. a cathode electrode in ohmic contact with the main emitter region and with the cathode base region at said cathode shunts; and
   H. an anode electrode in ohmic contact with the anode emitter region.

2. A thryristor according to claim 1 wherein the auxiliary emitter region is deeper into the cathode base region than the main emitter region.

3. A thyristor according to claim 2 wherein the auxiliary emitter region is of disc-shaped configuration and where C is the capacitance of a PN junction portion beneath and within the confines of the outer edge of the auxiliary emitter region between the cathode base region and the anode base region.

4. A thyristor according to claim 2 wherein the auxiliary emitter region is of annular configuration surrounding at the first upper surface a central portion of the cathode base region, and where C is the capacitance of a PN junction portion beneath and within the confines of the junction defining the central portion of the cathode base region.

* * * * *